United States Patent
Ensher et al.

(10) Patent No.: US 8,724,667 B2
(45) Date of Patent: May 13, 2014

(54) SYSTEM AND METHOD FOR MULTIPLE LASER SOURCES USING HIGH SEMICONDUCTOR OPTICAL AMPLIFIER EXTINCTION

(75) Inventors: Jason Ensher, Lafayette, CO (US); Michael Crawford, Lafayette, CO (US); Dennis Derickson, Lafayette, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 0 days.

(21) Appl. No.: 13/555,109

(22) Filed: Jul. 21, 2012

(65) Prior Publication Data
US 2013/0044772 A1 Feb. 21, 2013

Related U.S. Application Data

(60) Provisional application No. 61/510,794, filed on Jul. 22, 2011.

(51) Int. Cl.
*H01S 3/10* (2006.01)
(52) U.S. Cl.
USPC .......................................................... 372/20
(58) Field of Classification Search
USPC ............................................... 372/20, 32, 50
See application file for complete search history.

(56) References Cited

U.S. PATENT DOCUMENTS

| | | | | |
|---|---|---|---|---|
| 6,301,031 | B2 * | 10/2001 | Li | 398/9 |
| 6,665,320 | B1 * | 12/2003 | Arbore et al. | 372/20 |
| 7,181,105 | B2 * | 2/2007 | Teramura et al. | 385/27 |
| 7,512,295 | B2 * | 3/2009 | Welch et al. | 385/14 |
| 8,457,165 | B2 * | 6/2013 | Liu et al. | 372/20 |
| 2005/0013331 | A1 * | 1/2005 | Kish et al. | 372/32 |
| 2005/0013332 | A1 * | 1/2005 | Kish et al. | 372/32 |
| 2005/0018721 | A1 * | 1/2005 | Kish et al. | 372/20 |
| 2013/0182731 | A1 * | 7/2013 | Whitbread et al. | 372/20 |

FOREIGN PATENT DOCUMENTS

WO    WO/2012/042249    *  5/2012    ......... H01S 5/026

OTHER PUBLICATIONS

D. Lemus, Combining Multiple Semiconductor Laser Sources for Spectral Pulse Shaping, © 2010 Optical Society of America.*
B. Roycroft, Fast Switching Tunable Laser Sources for Wavelength Division Multiplexing in Passive Optical Access, May 2007 Matsue, Japan, 2007 International Conference on Indium Phosphide and Related Materials.*
T. Y. Fan, Laser Beam Combining for High-Power, High-Radiance Sources, May/Jun. 2005, IEEE Journal of Selected Topics in Quantum Electronics, Vol. 11, No. 3.*

* cited by examiner

*Primary Examiner* — Xinning Niu
*Assistant Examiner* — Vu A Vu
(74) *Attorney, Agent, or Firm* — Renner, Otto, Boisselle & Sklar, LLP.

(57) ABSTRACT

A system and method for passive combination of two or more laser sources (e.g., sampled grating distributed Bragg reflector (SG-DBR) lasers) into a single sweep that encompasses the combined range of the wavelengths of each laser source.

20 Claims, 5 Drawing Sheets

SYSTEM AND METHOD FOR MULTIPLE LASER SOURCES USING HIGH SEMICONDUCTOR OPTICAL AMPLIFIER EXTINCTION

RELATED APPLICATION DATA

This application claims the benefit of U.S. Provisional Application No. 61/510,794, filed Jul. 22, 2011, which is hereby incorporated in by reference.

TECHNICAL FIELD

The present invention relates generally to a system and method for passive combination of two or more electromagnetic sources (e.g., vernier-tuned distributed Bragg reflector (VTDBR) lasers) into a single sweep that encompasses the combined range of the wavelengths of each electromagnetic source.

BACKGROUND

In typical OCT and OFDR systems, the spatial resolution of the measurement is determined by the range of a continuous sweep of a tunable laser source. Therefore, the measurement time of an OCT or OFDR system is limited by how quickly the laser can scan the wide wavelength ranges—for example, 100 nm at a rate of 100 kHz. The spatial resolution of the measurement is also limited by the technical limit of how wide a wavelength range that a single laser can scan. The current, single state-of-the-art tunable lasers operating at 1310 nm or 1550 nm can scan, at most, a 40-60 nanometer (nm) range. In applications that require a continuous, monotonic sweep of wavelength versus time, there is a desire to avoid substantial gaps in time during the sweep, since these gaps can create problems for the measuring instrumentation and slow the sweep.

SUMMARY

Aspects of the present invention overcome the above identified problems by combining the outputs of two or more laser devices into a single sweep. For example, if the target laser sweep range is larger than a sweep range of a single laser device, it is advantageous to combine the outputs of two or more laser devices into a single sweep.

To combine these outputs in a manner that does not impact the sweep time in a significant way (e.g., increase time for the required sweep) and avoids putting substantive time gaps between the two or more subsections of the sweep, the transition from one laser device to another must be rapid. Although optical switches exist that could perform this task, they are either quite expensive, or too slow. Another way to combine the lasers is to passively combine their outputs, for example using a 1×2 optical splitter/combiner. The disadvantage to this approach is that the laser that is not being used needs to be able to be put into a mode where its output is not affecting the combined signal. If there is an amplifying device built into the laser, such as a semiconductor optical amplifier (SOA), the SOA can be de-powered in order to substantially reduce the output power of the laser that is not being used. However, it can be the case that even with the SOA de-powered, that the un-used laser still generates an un-wanted amount of power in wavelengths that are un-related to the desired wavelength emitted by the active laser source.

One aspect of the present invention relates to a system to combine a wavelength range of the electromagnetic output of a first electromagnetic radiation source and a second electromagnetic radiation source, the system including: the first electromagnetic radiation source configured to output electromagnetic radiation over a first range of wavelengths; the second electromagnetic radiation source configured to output electromagnetic radiation over a second range of wavelengths; the first and second electromagnetic radiation sources each comprising a semiconductor optical amplifier (SOA); and a controller coupled to the first and second electromagnetic radiation sources, wherein the controller is adapted to: control the output of electromagnetic radiation from the first and second electromagnetic radiation sources and tune the wavelength of the outputted electromagnetic radiation; select the first or second electromagnetic radiation source as a selected radiation source and the other electromagnetic source as a non-selected source; wherein the selected radiation source outputs electromagnetic radiation at a wavelength selected by the controller, the controller de-powers the semiconductor optical amplifier associated with the non-selected radiation source to place the non-selected radiation source in a deactivated state, and the controller drives the non-selected radiation source to a predetermined wavelength range wherein the semiconductor optical amplifier extinction ratio is optimized for depowering.

Another aspect of the invention relates to a method for passively combining the output of a first electromagnetic radiation source over a first wavelength range and a second electromagnetic radiation source over a second wavelength range into a single sweep encompassing the combined wavelength range of the first and second electromagnetic radiation sources, the method including: selecting the first or second electromagnetic source as a selected radiation source and the other electromagnetic source as a non-selected source; de-powering a semiconductor optical amplifier associated with the non-selected radiation source; driving the non-selected radiation source to a predetermined wavelength range wherein the semiconductor optical amplifier extinction ratio is optimized for depowering; generating electromagnetic radiation through the range of wavelengths with the selected radiation source; alternating the selected radiation source and the non-selected radiation source; de-powering the semiconductor optical amplifier associated with the non-selected radiation source; driving the non-selected radiation source to the predetermined wavelength range wherein the semiconductor optical amplifier extinction ratio is optimized for depowering; generating electromagnetic radiation through the range of wavelengths with the selected radiation source.

A number of features are described herein with respect to embodiments of the invention. It will be appreciated that features described with respect to a given embodiment also may be employed in connection with other embodiments.

The invention comprises the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1:
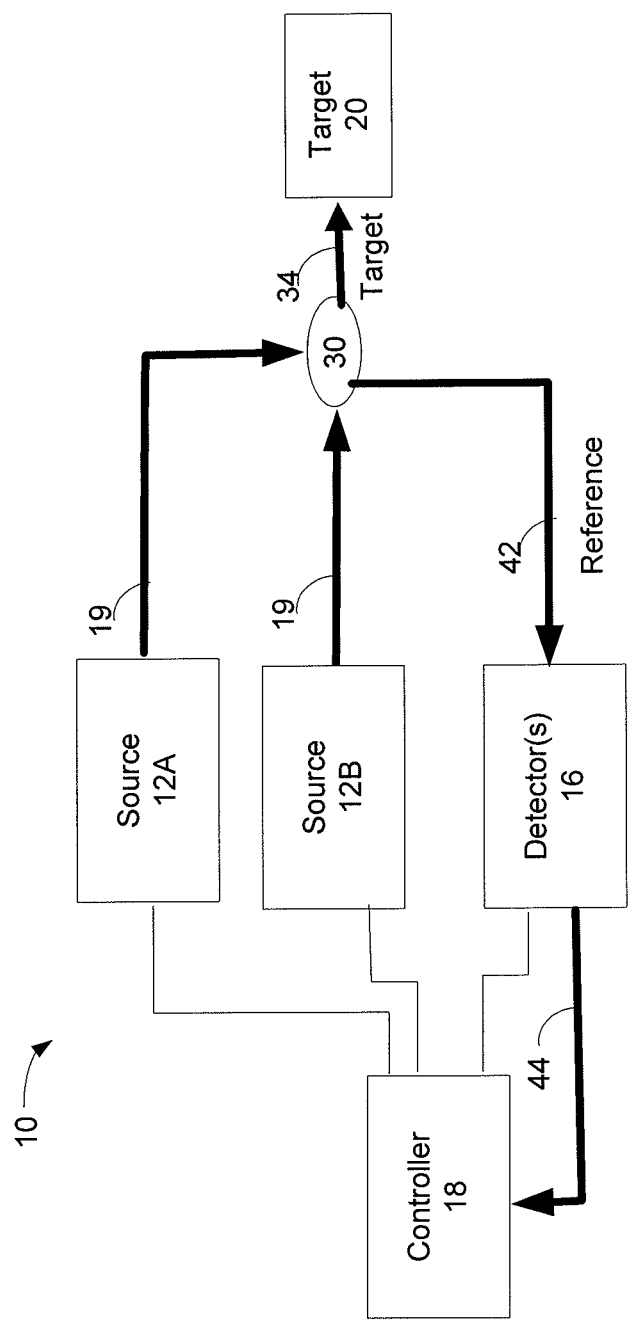
FIGS. 1-3 are exemplary systems in accordance with aspects of the present invention.

An exemplary swept electromagnetic radiation system 10 in accordance with aspects of the present invention is illustrated in FIG. 1. Referring to FIG. 1, the system 10 includes two or more electromagnetic radiation sources 12A, 12B. In another embodiment depicted in FIG. 2, the system 10 additionally includes an interferometer 14 (identified by dashed lines), a detector 16 and a controller 18. In both embodiments, electromagnetic radiation 19 is directed from each radiation source 12A, 12B—at different times—to a target 20 to detect a physical characteristic associated with the target.

Figure 2:
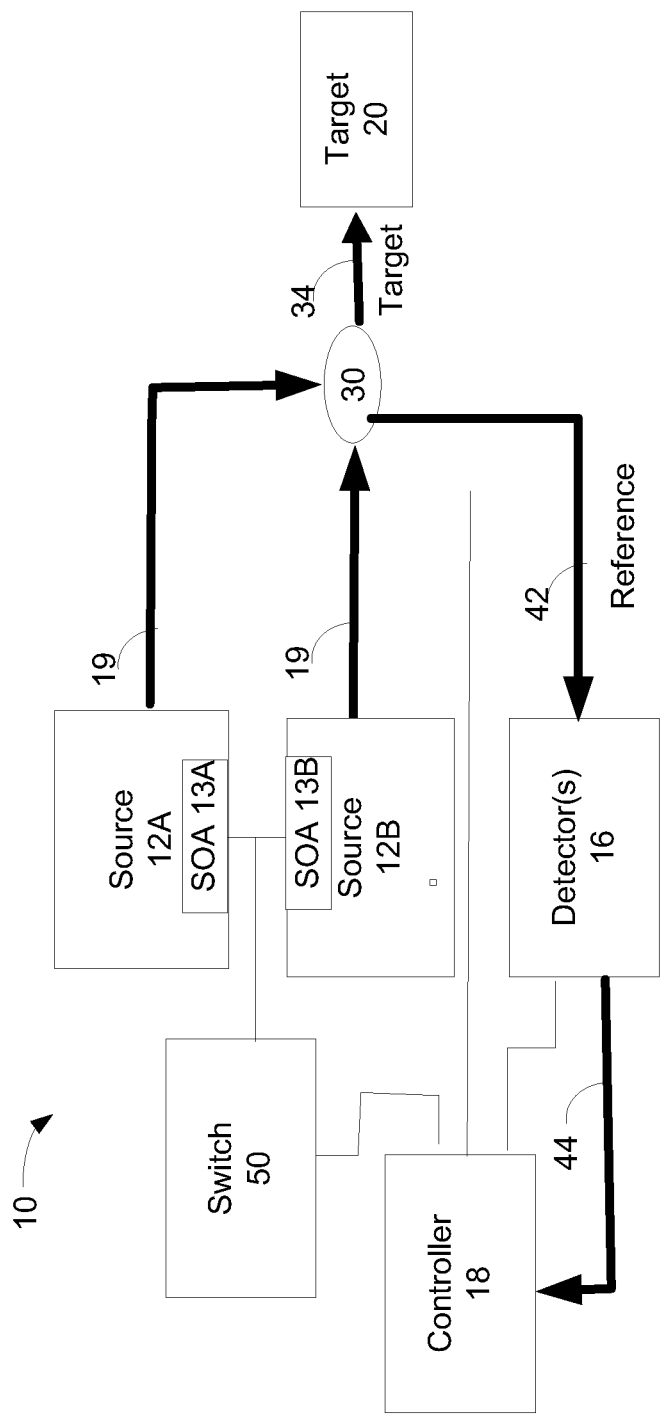

With further reference to FIGS. 1 and 2, the first electromagnetic radiation source 12A is operable to generate electromagnetic radiation through a first range of wavelengths and the second electromagnetic radiation source 12B is operable to generate electromagnetic radiation through a second range of wavelengths. The first and second range of wavelengths may be spectrally separated or have a portion that overlaps. Each of the radiation sources 12A, 12B further include a semiconductor optical amplifier (SOA) 13A, 13B.

In one embodiment of the present invention, the electromagnetic radiation sources 12A, 12B are electronically tunable lasers. The electronically tunable lasers may be a semiconductor laser that is electronically tunable to discretely move between the first range to the second range without continuously sweeping a region between the first and second range of wavelengths. For example, the electronically tunable lasers may be a sampled grating distributed Bragg reflector (SG-DBR) laser. The output wavelength of the SG-DBR laser may be electronically-tuned by adjusting one or more input currents to the device. In one exemplary illustration, the device may be tuned by changing input currents to the device (e.g., front mirror current, back mirror current, phase current, gain current, output amplifier current). By electronic tuning the output wavelength of the emitted electromagnetic radiation, the source 12A, 12B can be programmed and/or controlled by the controller 18 to scan the currents such that the wavelength scans over a first wavelength range from the first source 12A, then switches immediately (or within a small delay) to the source 12B to scan wavelengths over a second wavelength region. It is preferable, to place the un-used laser source (e.g., the un-used source is 12B when source 12A is emitting electromagnetic radiation or the un-used source is 12A when source 12B is emitting electromagnetic radiation) in a wavelength where the SOA extinction ratio is particularly high. For example, the laser system 10 has two or more semiconductor tunable lasers 12A, 12B that are combined passively, wherein when one laser is being used, the other one is disabled by de-powering the SOA 13 associated with the laser source, and then wavelength control circuitry of the un-used laser source is driven to a specific wavelength range wherein the SOA extinction ratio is optimized for depowering.

The extinction ratio for an optical component is equal to the ratio of optical power generated when the component is on to the optical power generated when the component is off. This implies that at a wavelength with a high extinction ratio, the optical power is much smaller when the component is off than the optical power when the component is on. For this reason—assuming the optical power of the component remains the same across different wavelength when on—the electromagnetic wavelength is more attenuable by the component at wavelengths with high extinction ratios.

Figure 4:
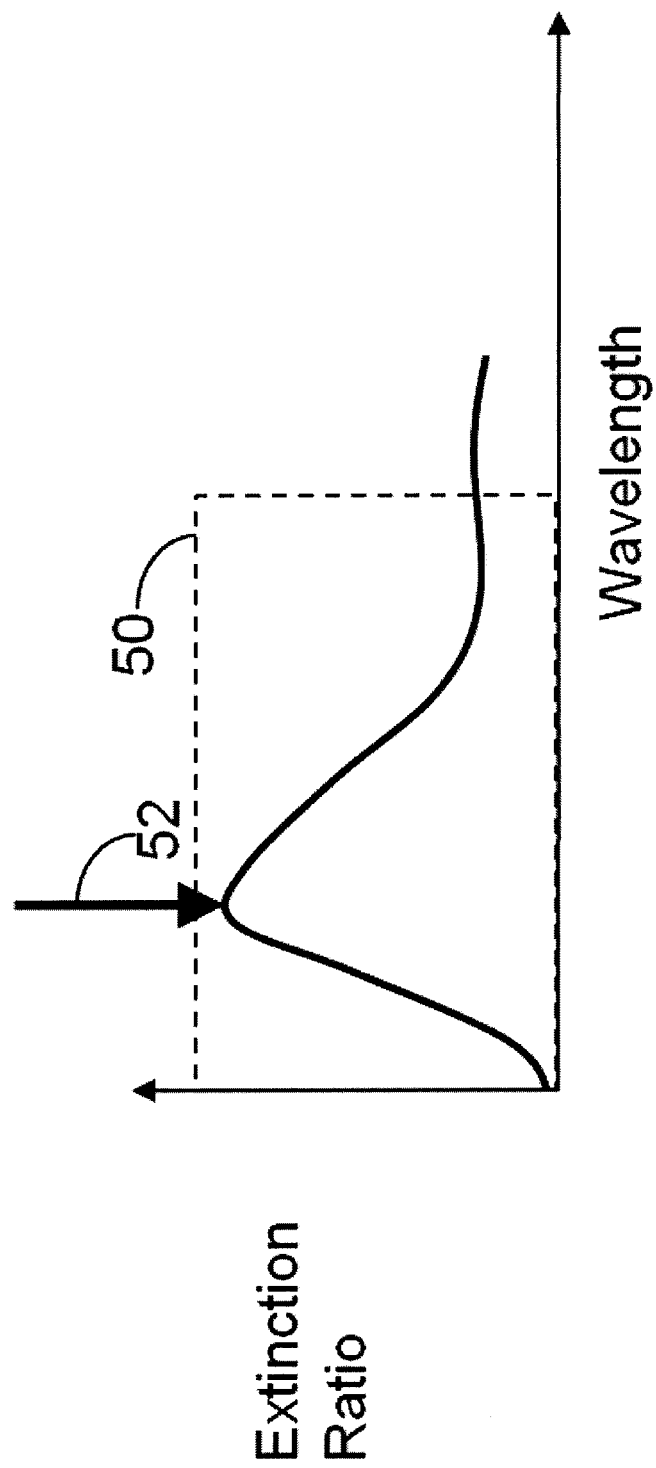
FIG. 4 illustrates an exemplary plot of the extinction ratio of an SOA with respect to wavelength.

FIG. 4 depicts an exemplary extinction ratio range for an SOA. The extinction ratio is dependent upon the wavelength of electromagnetic radiation. For example, the extinction ratio may vary within the wavelength range 50 of the electromagnetic source. An exemplary specific wavelength range wherein the SOA extinction ratio is optimized for depowering is identified by an arrow 52. In the wavelength range around the arrow 52, the extinction ratio is optimized for depowering because the high extinction ratio suggests high attenuation of the electromagnetic radiation at the wavelength by the SOA when off. By de-powering the SOA and driving the electromagnetic source to a wavelength with a high extinction ratio, any electromagnetic radiation output by the source will be attenuated by the SOA to eliminate any light output by the un-used laser source.

Other embodiments of the invention may comprise the use of tunable lasers such as Vertical-Cavity Surface-Emitting Lasers (VCSELs) or multi-section lasers such as Super-Structure Grating DBR lasers (SSG-DBRs), Digital Supermode DBR lasers (DS-DBRs) or Y-Branch lasers or other similar structures.

In one embodiment, a predetermined period of time elapses during the transition of the laser sources between the first laser source 12A and the second laser source 12B. The predetermined period of time may be any desired time. One design criterion is to minimize the period of time to shorten the sweep duration and have the period of time large enough to prevent interference between the sources.

Figure 3:
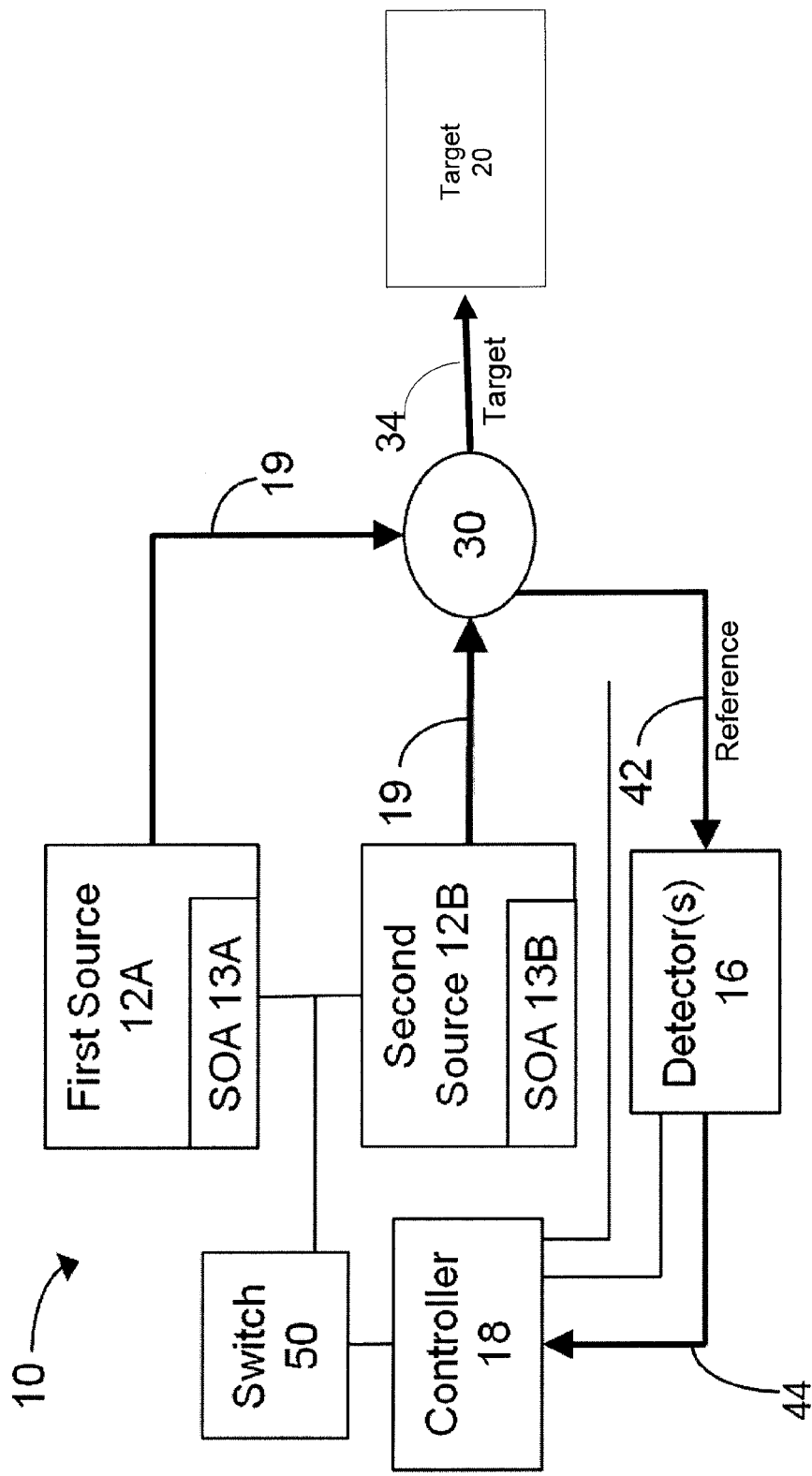

In another embodiment, illustrated in FIG. 3, the radiation source 12A and the radiation source 12B are coupled to the controller 18 through a switch 50. The switch 50 is controlled by the controller 18 and is operable to provide signaling to one of the two discrete sources 12A, 12B of electromagnetic radiation, such that only one source 12A or 12B outputs electromagnetic radiation at a given time.

Likewise, the two discrete sources 12A, 12B generate electromagnetic radiation through a range of wavelengths. The range of wavelengths of the two sources may be spectrally separated or have some overlap. For example, at least one electromagnetic radiation source generates electromagnetic radiation in the first range and the second electromagnetic radiation source is operable to generate electromagnetic radiation in the second range.

With further reference to FIG. 3, generally, the coupler 30 splits the received electromagnetic radiation into a reference path 32 and a target path 34.

The detector 16 generates one or more output signals 44 that are based on the received electromagnetic radiation from the reference path 32 or target path 34.

The output signals 44 are received by controller 18. The controller 18 is coupled to the detector 16 and the electromagnetic radiation sources 12A, 12B. The controller 18 selectively causes the source 12A to generate electromagnetic radiation through the first range and the second electromagnetic radiation source 12B to generate electromagnetic radiation in the second range. One aspect of the present invention relates to the un-used laser source is placed in a wavelength where the SOA extinction ratio is particularly high.

The controller 18 processes the output signals to represent data corresponding to amplitude and distance information detected by the detector 16. By combining two sources having different wavelength ranges, a larger sweep range is created than by using separate sources.

Figure 5:
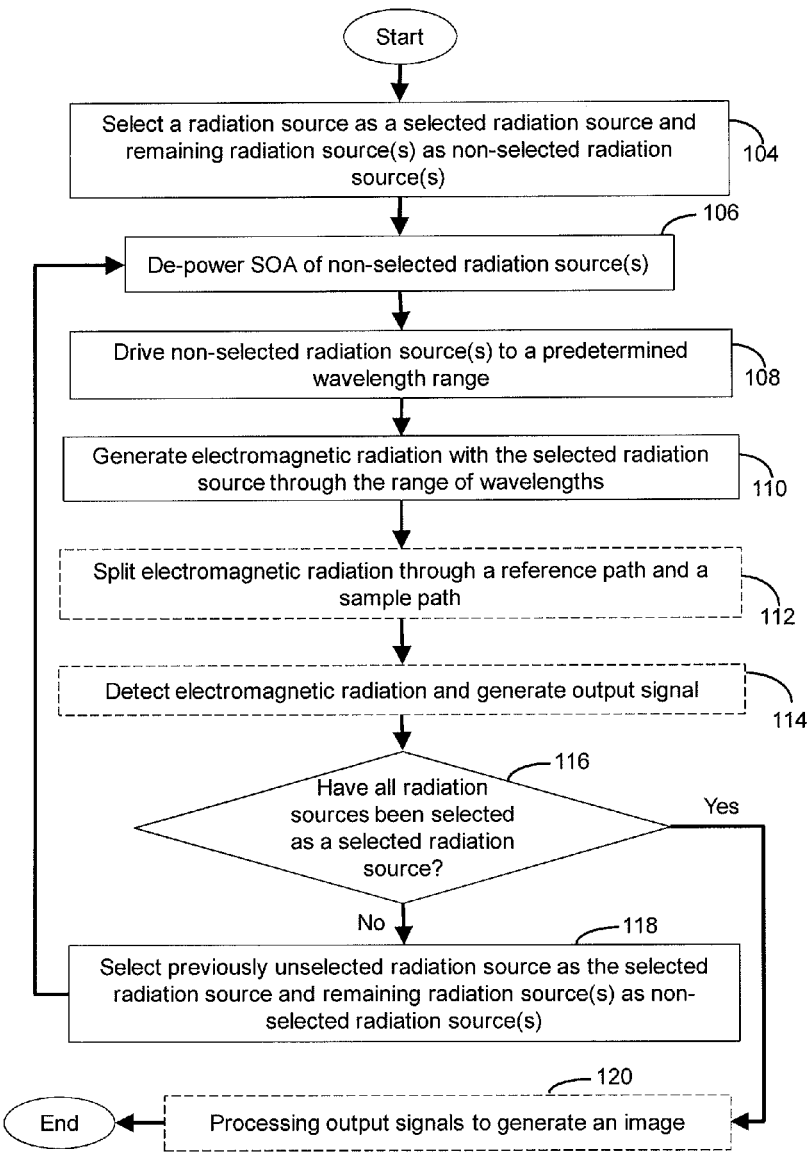
FIG. 5 illustrates a flow diagram depicting exemplary steps in a method for the passive combination of two or more electromagnetic sources into a single sweep that encompasses the combined range of the wavelengths of each laser source.

FIG. 5 illustrates exemplary method 100 for the passive combination of two or more electromagnetic sources into a single sweep that encompasses the combined range of the wavelengths of each electromagnetic source. In the method, at block 104, a radiation source is selected as a selected radiation source and the remaining radiation source or sources are deemed non-selected radiation sources. At block 106, the SOA of each non-selected radiation source is depowered. Each non-selected radiation source is directed to a predetermined wavelength range having a high extinction ratio in order to prevent light from being output by the non-selected radiation source(s). In step 108, the selected radiation source generates electromagnetic radiation through the range of wavelengths. For example: if the first electromagnetic radiation source is the selected radiation source, the selected radiation source will generate electromagnetic radiation through the first wavelength range; if the second electromagnetic radiation source is the selected radiation source, the selected radiation source will generate electromagnetic radiation through the second wavelength range; etc.

With further reference to FIG. 5, blocks 112 and 114 may be optionally performed. Blocks 112 and 114 may be performed if, e.g., the radiation sources are part of an imaging system utilized to detect a physical characteristic associated with a target. In block 112, the electromagnetic radiation from the selected source is split into a reference and sample path. In block 114, the electromagnetic radiation returned from the target path is detected and used to generate an output signal.

In block 116, a check is made to determine if all radiation sources have been selected as a selected radiation source. If all radiation sources have been selected as a selected radiation source, then optional step 120 may be performed. Similar to steps 112 and 114, step 120 may be performed if, e.g., the radiation sources are part of an imaging system utilized to detect a physical characteristic associated with a target. In step 120, the output signals generated in step 114 are processed to generate image signals. The output signals may be processed by the controller 18, computer device (not shown), or by any other suitable means. The image signals may comprise a 2D image, 3D image, part of an image, an A-scan, a B-scan, or any other image signal as understood by one of ordinary skill in the art. The resulting image or image data is formed from the at least two sources that have different wavelength ranges.

If all radiation sources have not been selected as a selected radiation source, then a previously unselected radiation source is selected as the selected radiation source and the remaining radiation sources as non-selected radiation sources 118. The method beginning at block 106 is then repeated for the new selected radiation source. Blocks 106-118 are repeated until each of the radiation sources have been selected as the selected radiation source.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A system to combine a wavelength range of the electromagnetic output of a first electromagnetic radiation source and a second electromagnetic radiation source, the system comprising:
the first electromagnetic radiation source configured to output electromagnetic radiation over a first range of wavelengths;
the second electromagnetic radiation source configured to output electromagnetic radiation over a second range of wavelengths;
the first and second electromagnetic radiation sources each comprising a semiconductor optical amplifier (SOA); and
a controller coupled to the first and second electromagnetic radiation sources, wherein the controller is adapted to:
control the output of electromagnetic radiation from the first and second electromagnetic radiation sources and tune the wavelength of the outputted electromagnetic radiation;
select the first or second electromagnetic radiation source as a selected radiation source and the other electromagnetic source as a non-selected source;
wherein the selected radiation source outputs electromagnetic radiation at a wavelength selected by the controller, the controller de-powers the semiconductor optical amplifier associated with the non-selected radiation source to place the non-selected radiation source in a deactivated state, and the controller drives the non-selected radiation source to a predetermined wavelength range wherein the semiconductor optical amplifier extinction ratio is optimized for depowering.

2. The system of claim 1, wherein the first range of wavelengths and the second of wavelengths at least partially overlap.

3. The system of claim 1, wherein the first range of wavelengths and the second range of wavelengths are non-overlapping.

4. The system of claim 1, further including a switch operably coupled between the first and second electromagnetic radiation sources and the controller, wherein the switch is configured to provide power to one of the first electromagnetic radiation source or the second electromagnetic radiation source at a given time.

5. The system of claim 1, wherein the electromagnetic radiation sources are semiconductor lasers.

6. The system of claim 5, wherein the electromagnetic radiation sources are sample grating distributed Bragg reflector (SG-DBR) lasers.

7. The system of claim 1, further comprising an interferometer coupled to the first and second electromagnetic radiation source, wherein the interferometer includes a reference path and a sample path.

8. The system of claim 7, further comprising a detector for receiving electromagnetic radiation returned from the reference path and the sample path, wherein the detector generates output signals corresponding to the received electromagnetic radiation.

9. The system of claim 8, wherein the output signals are processed to generate image signals over the first range of wavelengths and the second range of wavelengths.

10. A method for passively combining the output of a first electromagnetic radiation source over a first wavelength range and a second electromagnetic radiation source over a second wavelength range into a single sweep encompassing the combined wavelength range of the first and second electromagnetic radiation sources, the method comprising:
selecting the first or second electromagnetic source as a selected radiation source and the other electromagnetic source as a non-selected source;
de-powering a semiconductor optical amplifier associated with the non-selected radiation source;

driving the non-selected radiation source to a predetermined wavelength range wherein the semiconductor optical amplifier extinction ratio is optimized for depowering;
generating electromagnetic radiation through the range of wavelengths with the selected radiation source;
alternating the selected radiation source and the non-selected radiation source;
de-powering the semiconductor optical amplifier associated with the non-selected radiation source;
driving the non-selected radiation source to the predetermined wavelength range wherein the semiconductor optical amplifier extinction ratio is optimized for depowering;
generating electromagnetic radiation through the range of wavelengths with the selected radiation source.

11. The method of claim 10, further comprising splitting the electromagnetic radiation through the reference path and the sample path.

12. The method of claim 11, further comprising detecting electromagnetic radiation returned from the reference path and the sample path, wherein the detector generates output signals corresponding to the received electromagnetic radiation.

13. The method of claim 12, further comprising processing the output signals corresponding to the first range of wavelengths and the second range of wavelengths to generate an image.

14. A system to combine a wavelength range of the electromagnetic output of a first electromagnetic radiation source and a second electromagnetic radiation source, the system comprising:
the first electromagnetic radiation source configured to output electromagnetic radiation over a first range of wavelengths;
the second electromagnetic radiation source configured to output electromagnetic radiation over a second range of wavelengths;
the first and second electromagnetic radiation source each comprising a semiconductor optical amplifier (SOA);
an interferometer coupled to the first and second electromagnetic radiation source, wherein the interferometer includes a reference path and a sample path;
a detector for receiving electromagnetic radiation returned from the reference path and the sample path, wherein the detector generates output signals corresponding to the received electromagnetic radiation; and
a controller coupled to the detector and the first and second electromagnetic radiation sources, wherein the controller is adapted to:
control the output of electromagnetic radiation from the first and second electromagnetic radiation sources and tune the wavelength of the outputted electromagnetic radiation;
select the first or second electromagnetic source as a selected radiation source and the other electromagnetic source as a non-selected source;
wherein the selected radiation source outputs electromagnetic radiation at a wavelength selected by the controller, the controller de-powers the semiconductor optical amplifier associated with the non-selected radiation source to place the non-selected radiation source in a deactivated state, and the controller drives the non-selected radiation source to a predetermined wavelength range wherein the semiconductor optical amplifier extinction ratio is optimized for depowering.

15. The system of claim 14, wherein the first range of wavelengths and the second of wavelengths at least partially overlap.

16. The system of claim 14, wherein the first range of wavelengths and the second range of wavelengths are non-overlapping.

17. The system of claim 14, further including a switch operably coupled between the first and second electromagnetic radiation sources and the controller, wherein the switch is configured to provide power to one of the first electromagnetic radiation source or the second electromagnetic radiation source at a given time.

18. The system of claim 14, wherein the electromagnetic radiation sources are semiconductor lasers.

19. The system of claim 18, wherein the electromagnetic radiation sources are sample grating distributed Bragg reflector (SG-DBR) lasers.

20. The system of claim 14, wherein the controller processes the output signals to generate image signals over the first range of wavelengths and the second range of wavelengths.

* * * * *